(12) United States Patent
Kodaira

(10) Patent No.: US 6,301,110 B1
(45) Date of Patent: Oct. 9, 2001

(54) ELECTRONIC COMPONENT COOLING APPARATUS

(75) Inventor: Yuichi Kodaira, Tokyo (JP)

(73) Assignee: Sanyo Denki Co., Ltd., Tokyo (JP)

( * ) Notice: Subject to any disclaimer, the term of this patent is extended or adjusted under 35 U.S.C. 154(b) by 0 days.

(21) Appl. No.: 09/576,140

(22) Filed: May 22, 2000

(30) Foreign Application Priority Data

Sep. 30, 1999 (JP) .................................................. 11-279876
Sep. 30, 1999 (JP) .................................................. 11-279877

(51) Int. Cl.⁷ .................................................. H05K 7/20
(52) U.S. Cl. .......................... 361/697; 257/713; 165/121; 454/184; 361/692; 361/695
(58) Field of Search ...................................... 361/683–687, 361/690–699, 703, 707, 718, 722–724, 717, 719; 165/80.3, 104.233, 121, 185, 122; 257/713, 706, 707, 718, 721–726; 174/16.3; 415/213.1, 177, 214.1, 178; 454/184

(56) References Cited

U.S. PATENT DOCUMENTS

| | | |
|---|---|---|
| D. 403,760 | 1/1999 | Kodaira et al. . |
| 5,251,101 | 10/1993 | Liu . |
| 5,299,632 * | 4/1994 | Lee ...................................... 165/80.3 |
| 5,309,983 | 5/1994 | Bailey . |
| 5,421,402 | 6/1995 | Lin . |
| 5,452,181 | 9/1995 | Hoover . |
| 5,484,013 | 1/1996 | Morikawa et al. . |
| 5,486,980 * | 1/1996 | Jordan et al. ......................... 361/697 |
| 5,495,392 * | 2/1996 | Shen ..................................... 361/697 |
| 5,519,574 | 5/1996 | Kodama et al. . |
| 5,522,700 * | 6/1996 | Hong ................................... 415/177 |
| 5,584,339 * | 12/1996 | Hong ................................... 165/80.3 |
| 5,615,998 | 4/1997 | Kodama et al. . |
| 5,740,014 * | 4/1998 | Lin ........................................ 361/697 |
| 5,992,511 * | 11/1999 | Kodaira et al. ...................... 165/80.3 |
| 6,023,413 * | 2/2000 | Umezawa ............................ 361/697 |
| 6,109,340 * | 8/2000 | Nakase et al. ...................... 165/80.3 |
| 6,137,680 * | 10/2000 | Kodaira et al. ...................... 361/697 |

FOREIGN PATENT DOCUMENTS

| | | | |
|---|---|---|---|
| 0856888A2 * | 8/1998 | (EP) | ............................. H01L/23/467 |
| 6-268125 | 9/1994 | (JP) . | |
| 8-83873 | 3/1996 | (JP) . | |
| 10-223816 | 8/1998 | (JP) . | |

* cited by examiner

*Primary Examiner*—Leo P. Picard
*Assistant Examiner*—Michael Datskovsky
(74) *Attorney, Agent, or Firm*—Rankin, Hill, Porter & Clark LLP (57) ABSTRACT

An electronic component cooling apparatus capable of enhancing cooling efficiency while having a heat sink including a plurality of radiation fins which are arranged in parallel to each other incorporated therein. Radiation fins of a heat sink are arranged in parallel to a pair of side walls of the heat sink and so as to be spaced from each other at intervals. The heat sink is formed with a plurality of parting slits for interrupting continuity of a part of a base of the heat sink and radiation fins adjacent to the side walls of the heat sink. The parting slits are arranged so as to extend from an outside of the side walls of the heat sink into the heat sink and in a manner to be spaced from each other at predetermined intervals. The parting slits are formed into a length which prevents the parting slits from interrupting continuity of a portion of the radiation fins which is not exposed directly to air flow generated from by rotation of blades of an impeller of an axial fan unit.

11 Claims, 4 Drawing Sheets

ELECTRONIC COMPONENT COOLING APPARATUS

BACKGROUND OF THE INVENTION

This invention relates to an electronic component cooling apparatus for cooling an electronic component such as an MPU or the like, and more particularly to an electronic component cooling apparatus of the type that a heat sink on which an electronic component is mounted is forcibly cooled by air fed from a fan unit.

An electronic component cooling apparatus of the type that a heat sink including a plurality of radiation fins and a fan unit are combined with each other has been conventionally known in the art, as disclosed in Japanese Patent Application Laid-Open Publication No. 268125/1994, Japanese Patent Application Laid-Open Publication No. 83873/1996, U.S. Pat. Nos. 5,519,574, 5,484,013, 5,452,181, 5,421,402, 5,251,101, 5,309,983 and the like.

Also, U.S. Pat. No. 5,615,998 discloses an electronic component cooling apparatus which is provided with an engagement structure including a plurality of engaging sections provided at a fan unit and a plurality of engaged sections provided at a heat sink and engaged with the engaging sections of the fan unit. The engaging sections and engaged sections are permitted to be engaged with each other by merely approaching a casing of the fan unit to the heat sink.

Such a conventional electronic component cooling apparatus as described above is typically constructed so that air discharged from a fan unit and heated by radiation fins is exhausted in all directions from a heat sink. Also, an electronic component cooling apparatus disclosed in each of U.S. Pat. No. 5,309,983, 5,519,574 (FIG. 3A), Japanese Utility Model Publication No. 23034/1990 and U.S. Design Pat. No. 403,760 includes a heat sink in which a plurality of radiation fins are arranged in parallel to each other while being spaced from each other at intervals, so that air is discharged in two directions in which the radiation fins extend. Such arrangement of the radiation fins in a manner to be parallel to each other facilitates manufacturing of the heat sink, to thereby substantially reduce manufacturing cost of the heat sink, leading to a reduction in price of the electronic component cooling apparatus. However, such arrangement of the radiation fins fails to contribute to an increase in cooling efficiency even when air is forcibly blown against the radiation fins using a fan unit.

Another electronic component cooling apparatus is disclosed in U.S. Pat. No. 5,740,014, which is constructed so as to aim at an improvement in cooling efficiency. In the electronic component cooling apparatus, a heat sink is formed with a plurality of parting slits in a manner to be perpendicular to all of plural radiation fins arranged in parallel to each other on a base of the heat sink, to thereby divide the radiation fins into fine or thin plate-like strips. Then, air is forcibly blown against the strips from an axial fan unit, to thereby aim to improve cooling efficiency. The parting slits also partially divide the base of the heat sink into sections. Also, in the electronic component cooling apparatus, the fan unit is fixed on the heat sink by means of screws.

Still another electronic component cooling apparatus is taught in Japanese Patent Application Laid-Open Publication No. 223816/1998, which is constructed in such a manner that a plurality of pin-like or bar-like radiation fins are integrally mounted on a base of a heat sink and the base is formed on an outer periphery thereof with a plurality of slits. A fan unit is fixed on the base of the heat sink by means of screws.

The above-described electronic component cooling apparatus taught in U.S. Pat. No. 5,740,014 wherein the radiation fins arranged in parallel to each other are divided into the strips fails to satisfactorily improve cooling efficiency. In the electronic component cooling apparatus, the fan unit is fixed on the heat sink by means of screws.

The electronic component cooling apparatus disclosed in U.S. Design Pat. No. 403,760 and briefly described above is provided with an engagement structure including a plurality of engaging sections provided at a fan unit and a plurality of engaged sections provided at a heat sink and engaged with the engaging sections, as in U.S. Pat. No. 5,615,998.

SUMMARY OF THE INVENTION

The present invention has been made in view of the foregoing disadvantage of the prior art.

Accordingly, it is an object of the present invention to provide an electronic component cooling apparatus which is capable of significantly raising cooling efficiency while employing a structure wherein a plurality of radiation fins are arranged on a heat sink in a manner to be parallel to each other.

It is another object of the present invention to provide an electronic component cooling apparatus which is capable of highly improving cooling efficiency, wherein a heat sink is formed with a plurality of parting slits and a good heat-transfer plate is joined to a base of the heat sink.

It is a further object of the present invention to provide an electronic component cooling apparatus which is capable of facilitating positioning between a casing of a fan unit and a heat sink and preventing engagement therebetween from being readily released.

In accordance with the present invention, an electronic component cooling apparatus is provided. The electronic component cooling apparatus includes a heat sink including a base and a pair of side walls arranged so as to be raised from a pair of ends of the base opposite to each other. The base has a rear surface mounted thereon with an electronic component to be cooled and a front surface provided thereon with a plurality of radiation fins and the radiation fins are positioned between the side walls of the heat sink. The electronic component cooling apparatus also includes an axial fan unit including an impeller provided with a plurality of blades, a motor including a revolving shaft fixedly mounted thereon with a rotor on which the impeller is mounted and acting to rotate the impeller, a casing provided with an opening for receiving the impeller and motor therein, and a plurality of webs for connecting the housing of the motor and the casing to each other so as to position the motor at a central portion of the opening. The axial fan unit forcibly guides air in an axial direction of the revolving shaft. The radiation fins of the heat sink are arranged in a manner to be parallel to the side walls of the heat sink and spaced from each other at predetermined intervals.

The heat sink is formed with a plurality of parting slits so as to be spaced from each other at predetermined intervals and in a manner to continuously extend from an outside of at least one of the side walls of the heat sink into the heat sink to interrupt continuity of a part of the base, at least one side wall of the heat sink and the radiation fins adjacent to the side walls of the heat sink.

In the present invention, the parting slits are arranged so as not to interrupt continuity of a portion of the radiation fins which is not exposed directly to air flow generated by rotation of the blades of the impeller. In other words, the parting slits are formed into a length which prevents the parting slits from interrupting continuity of a portion of the radiation fins of the heat sink positioned inside a portion thereof opposite to the blades of the impeller. It is not required that the parting slits are formed on a whole portion of the radiation fins other than the portion of the radiation fins which is not exposed directly to air flow generated by rotation of the blades of the impeller or the portion of the radiation fins positioned inside the portion thereof opposite to the blades of the impeller. Thus, the parting slits may be formed into any desired length in view of cooling efficiency.

The inventors made a study on the reason why a structure of dividing each of radiation fins arranged in parallel to each other into a plurality of strips by means of parting slits as in the heat sink incorporated in the electronic component cooling apparatus disclosed in U.S. Pat. No. 5,740,014 fails to improve cooling efficiency. As a result, it was found that when continuity of the portion of the radiation fins which is not exposed directly to air flow generated by rotation of the blades of the impeller or the portion of the radiation fins positioned inside the portion thereof opposite to the blades of the impeller is interrupted, a temperature at the strips formed at the portion (central strips) is kept increased as compared with a temperature at the strips (surrounding strips) at the portion of the radiation fins exposed directly to air flow generated by rotation of the blades of the impeller due to a deterioration in discharge of heat from the central strips. This is for the reason that the parting strips deteriorates transfer of heat from the central strips to the surrounding strips. Arrangement of such central strips is excluded from the electronic component cooling apparatus of the present invention. Thus, in the present intention, heat at the portion of the radiation fins which is not opposite to the blades of the axis fan unit is smoothly transferred to an outer portion of the radiation fins cooled directly by the axial fan unit without interruption, to thereby be effectively discharged therefrom. This permits a central portion of the heat sink to be effectively cooled, resulting in cooling efficiency being improved.

In addition, blowing of air against the heat sink from the axial fan unit enhances cooling efficiency as compared with suction of air into the axial fan unit from the heat sink.

Also, formation of the parting slits in a manner to extend from the outside of both side walls of the heat sink into the heat sink increases cooling efficiency as compared with formation of the parting line extending from the outside of one of the side walls of the heart sink.

In a preferred embodiment of the present invention, the base of the heat sink has a good heat-transfer plate joined to the rear surface thereof so as to transfer heat from a heat source (electronic component) to at least the part of the base of the heat sink formed with the parting slits. The good heat-transfer plate is made of a material superior in thermal conductivity to that for the base of the heat sink. Such construction permits heat generated from the heat source to be rapidly transferred to a low-temperature portion of the heat sink, to thereby further enhance heat radiation efficiency or cooling efficiency. In this instance, the good heat-transfer plate is preferably arranged so that a part thereof is cooled by air flowing through an opening of each of the parting slits interrupting continuity of the base of the heat sink. This permits an outer periphery of the good heat-transfer plate to be cooled directly by air discharged from the axial fan unit.

In a preferred embodiment of the present invention, the base is formed at the part thereof at which the parting slits are formed into a thickness smaller than that of the remaining part thereof so that a gap may be defined between a bottom surface of the base and the part of the good heat-transfer plate. Thus, the outer periphery of the heat-transfer plate is satisfactorily cooled by air discharged from the parting slits.

The parting slits are preferably varied in length depending on a position at which the parting slits are formed.

In a preferred embodiment of the present invention, the parting slits are formed on the side walls of the heat sink. This provides a plurality of slit sections for air flow or air passage which extend from a distal end of the side walls of the heat sink toward the base of the heat sink to guide air flow generated by the fan unit therethrough. In this instance, the side walls of the casing each are provided thereon with at least one positioning fit projection fitted in at least one of the slit sections. The positioning fit projections and engaging sections are arranged so as to have positional relationship defined therebetween which permits the engaging sections and engaged sections to be engaged with each other while fitting the positioning fit projections in the slit sections.

Such construction permits fitting between the slit sections and the positioning fit projections to provide a detachment or disengagement preventing structure, to thereby prevent release of engagement between the casing and the heat sink when force of sliding both relative to each other is applied to one of them.

In a preferred embodiment of the present invention, the side walls of the casing each are integrally provided thereon with two hooks in a manner to be spaced from each other. The hooks of each of the side walls of the casing are positioned inside the remaining part of the side walls of the casing so as to be positioned inside the side walls of the heat sink when the heat sink and casing are combined with each other. The hooks each are formed with an engaging surface so as to outwardly extend therefrom. The side walls of the heat sink are formed on an inner surface thereof with engaged surfaces adapted to be engaged with the engaging surfaces of the hooks. Such construction permits engagement between the engaging sections of the casing and the engaged sections of the heat sink to be released by separating the casing from the heat sink when force of approaching side walls of the casing to each other is applied thereto.

In a preferred embodiment of the present invention, the side walls of the heat sink are formed into a length larger than that of the side walls of the casing. The side walls of the heat sink are formed with a plurality of slits which extend by a distance larger than a length of the side walls of the casing so that a position at which the fan unit is mounted on the heat sink may be varied. Such construction permits the fan unit to be positioned in conformity to the heat generation source of the electronic component, to thereby more further improve cooling efficiency of the electronic component cooling apparatus.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, an electronic component cooling apparatus according to the present invention will be described hereinafter with reference to the accompanying drawings.

Referring to FIGS. 1 to 4, an embodiment of an electronic component cooling apparatus according to the present invention is illustrated. An electronic component cooling apparatus of the illustrated embodiment which is generally designated at reference numeral 1 is adapted to cool an MPU (electronic component) and generally includes a heat sink 3 integrally made of aluminum by extrusion molding and cutting and an axial fan unit 5 mounted on the heat sink 3. Thus, the electronic component cooling apparatus of the illustrated embodiment is constituted by the heat sink 3 and the axial fan unit 5 mounted on the heat sink 3.

The heat sink 3 includes a rectangular base 7 and a pair of side walls 9A and 9B integrally arranged on both sides of the base 7 defined in a direction perpendicular to a longitudinal direction of the base 7 so as to extend toward a casing of the axial fan unit 5. An electronic component MPU to be cooled may be mounted on/at rear surface of the base 7 through a holder. Alternatively, it may be mounted directly on the base 7 by means of an adhesive.

Figure 3:
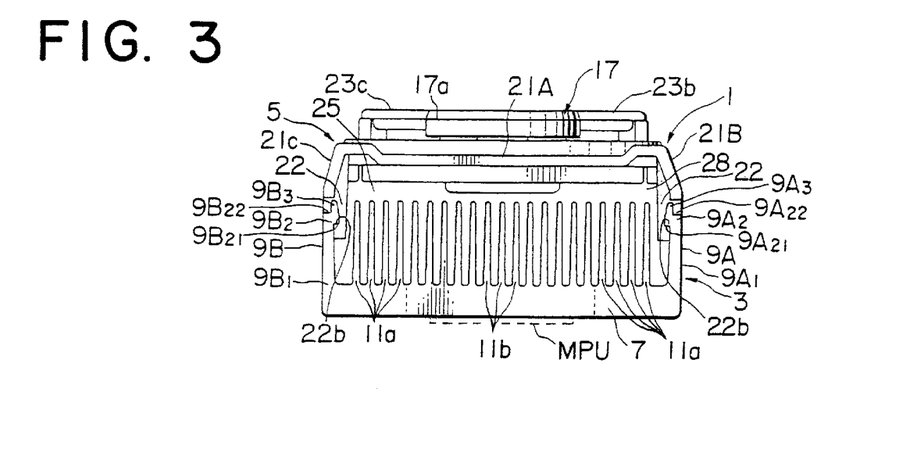
FIG. 3 is a left side elevation view of the electronic component cooling apparatus shown in FIG. 1.
Figure 4:
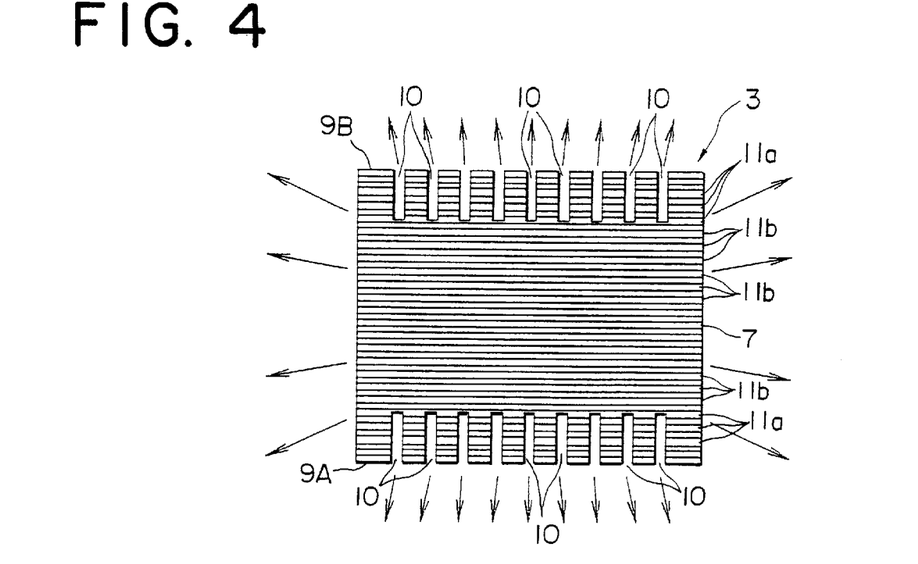
FIG. 4 is a plan view showing a heat sink which may be incorporated in the electronic component cooling apparatus shown in FIG. 1.

The base 7 of the heat sink 3, as shown in FIGS. 3 and 4, is integrally provided on a front surface thereof with a plurality of radiation fins 11a and 11b. The radiation fins 11a and 11b each are arranged so as to extend in the longitudinal direction of the base 7 of the heat sink 3. Also, the radiation fins 11a and 11b are arranged so as to be substantially parallel to each other in a lateral or width direction of the base 7 perpendicular to the longitudinal direction thereof while being spaced from each other in the width direction and interposed between the side walls 9A and 9B of the heat sink 3. Further, the radiation fins 11a and 11b each are formed so as to extend in the longitudinal direction of the base 7 while keeping a height thereof substantially unvaried. As will be noted from FIG. 3, the radiation fins 11a and 11b each are so formed that a width thereof is gradually reduced with an increase in vertical distance from the front surface of the base 7 of the heat sink 3.

The side walls 9A and 9B of the heat sink 3, as shown in FIG. 3, include wall body sections 9A1 and 9B1, horizontal sections 9A2 and 9B2 formed on a distal or upper end of the wall body sections 9A1 and 9B1 so as to horizontally inwardly extend therefrom, and fit end sections 9A3 and 9B3 formed on an inner end of the horizontal sections 9A2 and 9B2 so as to upwardly extend therefrom, respectively. The side walls 9A and 9B are arranged so as to extend in the longitudinal direction of the base 7 of the heat sink 3 continuously or without interruption before formation of parting slits 10 described hereinafter. The horizontal sections 9A2 and 9B2 have inner surfaces arranged so as to face the base 7 of the heat sink 3, respectively, which constitute engaged surfaces 9A21 and 9B21 engaged with engaging surfaces 22b of two hooks 22 provided on side walls 21B and 21C of a casing 21 described hereinafter, respectively. The horizontal sections 9A2 and 9B2 have outer surfaces positioned on a side thereof opposite to the engaged surfaces 9A21 and 9B21, respectively, which constitute contact surfaces 9A22 and 9B22 with which the side walls 21B and 21C of the casing 21 are contacted at a part thereof, respectively. The engaged surfaces 9A21 and 9B21 are formed so as to extend in a longitudinal direction of the side walls 9A and 9B continuously or without interruption before formation of the parting slits 10. Likewise, the contact surfaces 9A22 and 9B22 are arranged so as to continuously extend in the longitudinal direction before formation of the parting slits 10.

The heat sink 3 is formed with a plurality of the parting slits 10 briefly described above in a manner to continuously extend from an outside of the side walls 9A and 9B of the heat sink 3 into the heat sink 3 to interrupt continuity of a part of the base 7 and the radiation fins 11a adjacent to the side walls 9A and 9B of the heat sink 3. The parting slits 10 are arranged so as to be spaced from each other at predetermined intervals. The parting slits 10 may be formed by preforming the heat sink 3 by extrusion molding and then subjecting the outside of the side walls 9A and 9B of the heat sink 3 thus preformed to cutting by an NC machine tool. The parting slits 10 may be formed into the same length so as not to interrupt continuity of a portion of the radiation fins 11b which is not exposed to air flow generated by rotation of blades 13 of an impeller 15 of the axial fan unit 5 described hereinafter. In other words, the parting slits 10 are formed into a length which prevents the parting lines 10 from interrupting continuity of a portion or region of the radiation fins 11b positioned inside a portion or region thereof opposite to the blades 13 of the impeller 15 of the axial fan unit 5. As shown in FIG. 4, the radiation fins 11b positioned at a cental portion of the base 7 of the heat sink 3 are arranged so as to extend in the longitudinal direction of the base 7 without being interrupted by the parting slits 10. Such arrangement of the parting slits 10 permits heat at the portion of the radiation fins 11b which is not opposite to the blades 13 of the axial fan unit 5 or a central region of the radiation fins 11b to be discharged or dissipated through the radiation fins 11b continuous with an outer portion of the radiation fins 11b or a portion of the radiation fins defined on each of both sides thereof in the longitudinal direction directly cooled by air flow generated by the axial fan unit 5. Thus, the electronic component cooling apparatus of the illustrated embodiment permits a central region of the heat sink 7 to be significantly decreased in temperature, to thereby enhance cooling efficiency.

The side walls 9A and 9B of the heat sink 3 are formed with the parting slits 10 as described above, resulting in providing a plurality of slit sections 12 (FIG. 2) for air flow or air passage which extend from a distal end of the side walls 9A and 9B of the heat sink 3 toward the base 7 of the heat sink so as to guide air flow produced by the fan unit 5 therethrough.

Figure 1:
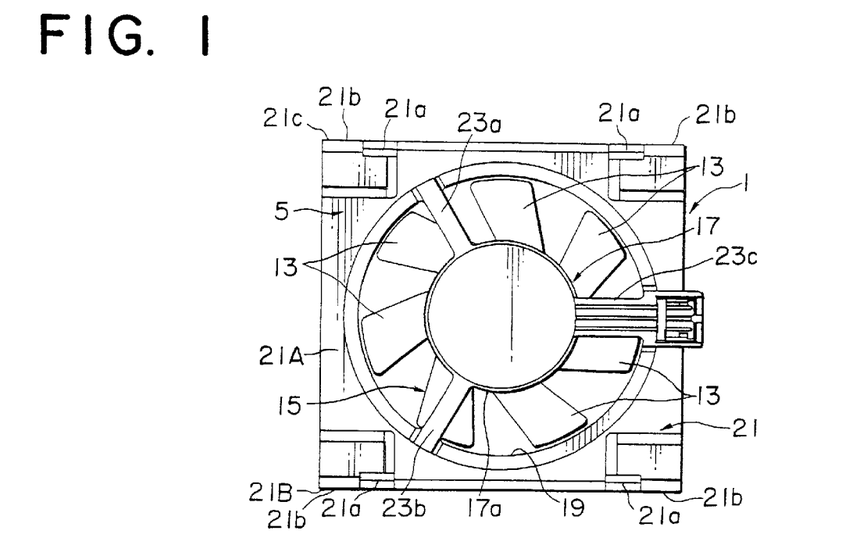
FIG. 1 is a plan view showing a first embodiment of an electronic component cooling apparatus according to the present invention.

The axial fan unit 5, as shown in FIG. 1, includes the impeller 15 briefly described above and including seven such blades 13 briefly described above, a motor 17 having a revolving shaft (not shown) fixedly mounted thereon with the impeller 15 and actuated so as to rotate the impeller 15, the casing 21 briefly described above and formed with a suction opening 19 in which the impeller 15 and motor 17 are received, and three webs 23a to 23c for connecting a housing 17a of the motor 17 to the casing 21 to position the motor 17 at a central portion of the suction opening 19. In the illustrated embodiment, the casing 21, the housing 17a of the motor 17 and three such webs 23a to 23c are integrally formed of a material mainly consisting of a synthetic resin material by molding. The motor 17 may include an internal structure which may be constructed in any conventional manner as disclosed in, for example, Japanese Patent Application Laid-Open Publication No. 83873/1996.

The blades 13 of the impeller 15 of the axial fan unit 5 are constructed so as to permit air sucked from the suction opening 19 toward the base 7 in an axial direction of the revolving shaft of the motor 17 to be forcibly discharged in a radial direction of the revolving shaft of the motor 17. It is of course that the fan unit 5 is constructed in the form of an axial fan, to thereby permit a part of air sucked to flow in the axial direction or toward the base 7.

The casing 21 includes an opposite wall 21A arranged opposite to a front surface of the heat sink 3 while being spaced therefrom at an interval and a pair of the above-described side walls 21B and 21C arranged on both sides of the opposite wall 21A defined in a longitudinal direction of the wall 21A so as to extend in the longitudinal direction and downwardly extend toward the heat sink 3, and an annular wall 21D arranged on the opposite wall 21A so as to extend in a direction away from the opposite wall 21A and having the suction opening 19 defined therein. The side walls 21B and 21C of the casing 21 and the side walls 9A and 9B of the heat sink 3 cooperate with each other to form two discharge ports 25 and 27 on both sides of the electronic component cooling apparatus 1 defined in a longitudinal direction thereof, respectively, when the casing 21 and heat sink 3 are combined with each other. This results in an air flow space 28 which continuously extends from any one of the discharge ports 25 and 27 to the other discharge port being formed between an end of the radiation fins 11a and 11b positioned on a side of the casing 21 and the opposite wall 21A of the casing 21.

Air discharged from the blades 13 which are being rotated is guided through a circumference of the radiation fins 11a and 11b and the air flow space 28 to the discharge ports 25 and 27 and then exhausted from the ports 25 and 27. Such construction permits air discharged in the radial direction of the revolving shaft of the motor 17 from the blades 13 of the axial fan unit 5 to partially flow toward the discharge ports 25 and 27 while being guided in the air flow space 28 reduced in resistance, during which the air effectively cools the radiation fins 11b. Also, air is outwardly discharged through the parting slits 10, so that the radiation fins 11a of which continuity is interrupted by the parting slits 10 are cooled. In addition, air discharged in the axial direction of the revolving shaft of the motor 17 from the blades 13 of the axial fan unit 5, resulting in striking on the base 7 of the heat sink 3 is partially guided to the air flow space 28 while passing through a plurality of flow passages defined between the radiation fins 11b adjacent to each other and discharged through the discharge ports 25 and 27. Thus, a reduction in flow resistance due to the air flow space 28 and three kinds of air flow described above synergistically cooperate with each other to increase cooling efficiency. Streams of air discharged from the heat sink 3 are indicated at arrows in FIG. 4. In this regard, an experiment by the inventors indicated that the electronic component cooling apparatus of the illustrated embodiment wherein the parting slits 10 are not formed on the radiation fins 11b is increased in cooling efficiency by about 6% as compared with an electronic component cooling apparatus which is so constructed that the parting slits 10 are entirely formed on the radiation fins 11b except a part of the base 7.

Figure 2:
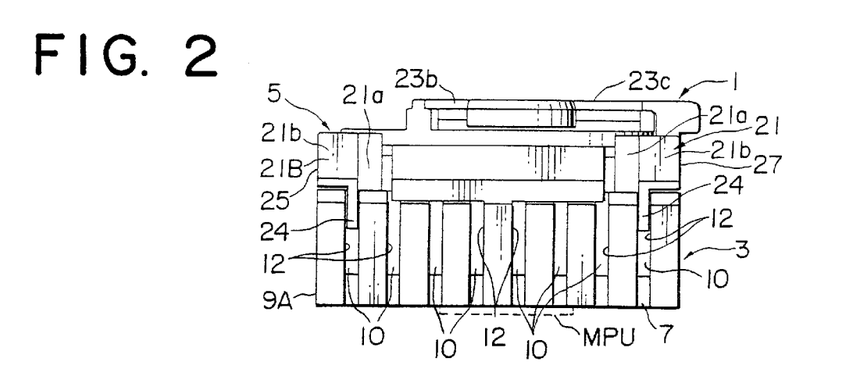
FIG. 2 is a front elevation view of the electronic component cooling apparatus shown in FIG. 1.

The side walls 21B and 21C of the casing 21, as shown in FIG. 2, each are integrally provided with positioning fit projections 24 which are fitted in the slit sections 12 formed on both ends of the side walls 9A and 9B of the heat sink 3, respectively. Also, the side walls 21B and 21C are integrally provided with the above-described two hooks 22 in proximity to the fit projections 24, as shown in FIG. 3. The hooks 22 each act as an engaging section. The hooks 22 are arranged so as to extend from the side walls 21B and 21C of the casing 21 toward the heat sink 3 and in juxtaposition to the fit projections 24. The hooks 22 of the side walls 21B and 21C of the casing 21 are arranged so as to be positioned inside the remaining part of the side walls 21B and 21C, resulting in being positioned inside the side walls 9A and 9B of the heat sink 3, when the casing 21 is combined with the heat sink 3. Such arrangement permits the side walls 21B and 21C of the casing 21 to be formed at a portion thereof corresponding to the hooks 22 with recesses 21a. The hooks 22, as shown in FIG. 3, each are so formed that the engaging surface 22b briefly described above is outwardly projected in the width direction of the casing 21. This permits the engaging surface 22b of each of the hooks 22 to be engaged with each of the engaged surfaces 9A21 and 9B21 of the side walls 9A and 9B of the heat sink 3, resulting in the casing 21 being detachably mounted on the heat sink 3. Positional relationship between the fit projections 24 and the hooks (engaging sections) 22 is defined so as to permit the engaging surfaces 22b of the hooks 22 to be engaged with the engaged surfaces 9A21 and 9B21 when the fit projections 24 are fitted in the slit sections 12 on both ends of the side walls 9A and 9B of the heat sink 3, respectively.

Now, mounting of the casing 21 on the heat sink 3 by manual operation will be described.

First, portions 21b (FIGS. 1 and 2) positioned on two such positioning fit projections 24 respectively arranged on the side walls 21B and 21C of the casing 21 are interposedly held by the thumb and index finger of each of hands of an operator and then each pair of portions 21b opposite to each other are approached to each other, to thereby apply force to the side walls 21B and 21C of the casing 21. Then, the casing 21 is approached to the heat sink 3 to insert the positioning fit projections 24 into the slit sections 12. At this time, the hooks 22 of the casing 21 are arranged inside the side walls 9B and 9B of the heat sink 3. Then, application of force to the side walls of the casing 21 is released. Such operation permits the engaging surfaces 22b of the hooks 22 of the casing 21 to be engaged with the engaged surfaces 9A21 and 9B21 of the heat sink 3. Release of the engagement therebetween may be attained by approaching the portions 21b of the side walls of the casing opposite to each other. Concurrently, the casing 21 is separated from the heat sink 3, resulting in the engaging surfaces 22b of the hooks 22 of the casing 21 being released from engagement with the engaged surfaces 9A21 and 9B21 of the heat sink 3. In the illustrated embodiment, the positioning fit projections 24 are fitted in the slit sections 12 to provide a detachment or disengagement preventing structure which prevents engagement between the engaging sections of the casing 21 and the engaged sections of the heat sink 3 from being released even when pushing force is applied to one of the casing 231 and heat sink 3.

Figure 5:
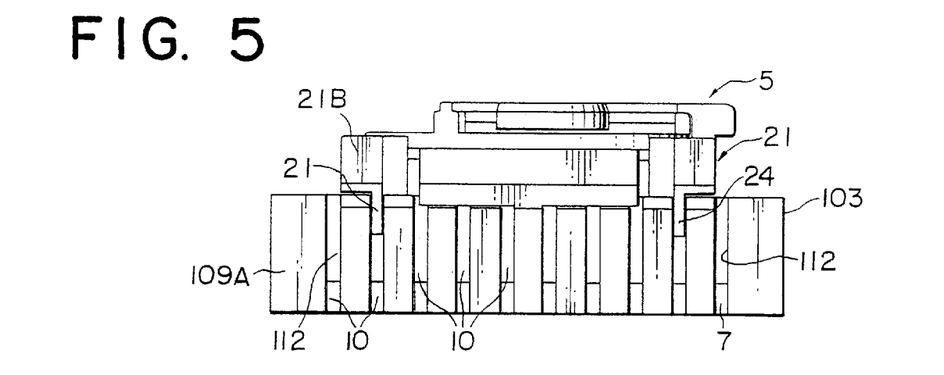
FIG. 5 is a front elevation view showing a second embodiment of an electronic component cooling apparatus according to the present invention wherein an axial fan unit and a heat sink are combined together in a first manner.
Figure 6:
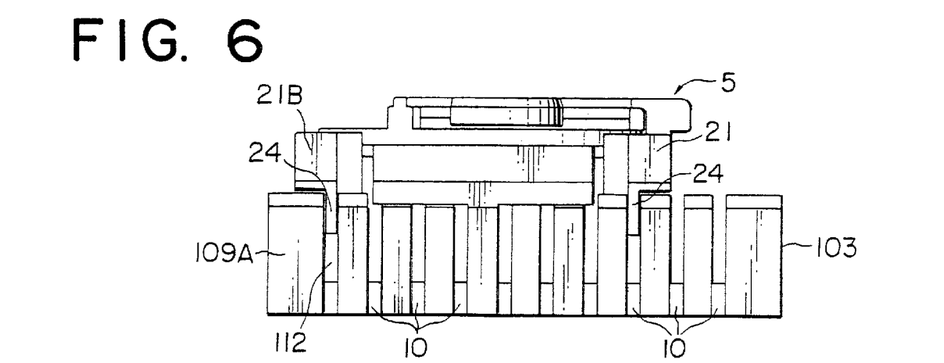
FIG. 6 is a front elevation view of the electronic component cooling apparatus shown in FIG. 5 wherein the axial fan unit and heat sink are combined together in a second manner.

Referring now to each of FIGS. 5 and 6, a second embodiment of an electronic component cooling apparatus according to the present invention is illustrated, wherein combination between an axial fan unit 5 and a heat sink 103 in FIG. 5 and that in FIG. 6 are carried out in manners different from each other. In connection with the illustrated embodiment, reference numerals correspond to those discussed in the first embodiment described above. In the illustrated embodiment, the heat sink 103 is so constructed that a pair of side walls 109A of the heat sink 103 are formed into a length larger than that of a pair of side walls 21B of a casing 21. The side walls 109A of the heat sink 103 are formed with slit sections 112 so as to extend by a distance larger than a length of the side walls 21B of the casing 21 so that a position at which the axial fan unit 5 is mounted on the heat sink 103 may be varied. Such construction permits the axial fan unit 5 to be positioned in conformity with a heat generation source of an electronic component mounted on a rear surface of a base of the heat sink 103.

Figure 7:
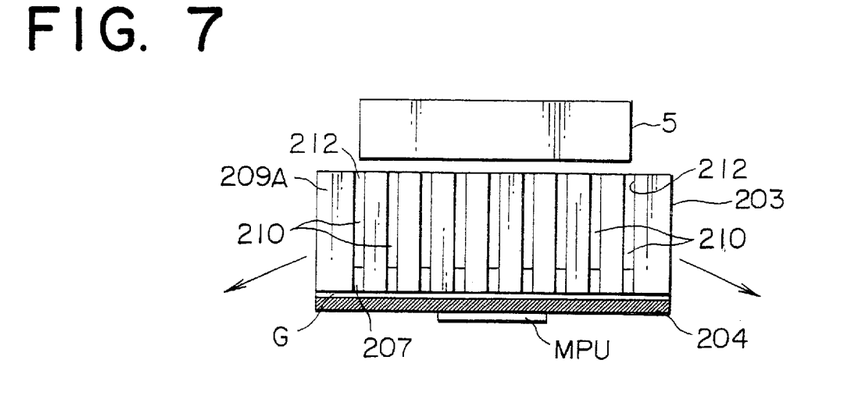
FIG. 7 is a front elevation view showing a third embodiment of an electronic component cooling apparatus according to the present invention, wherein an axial fan unit is indicated by a block for the sake of brevity.
Figure 8:
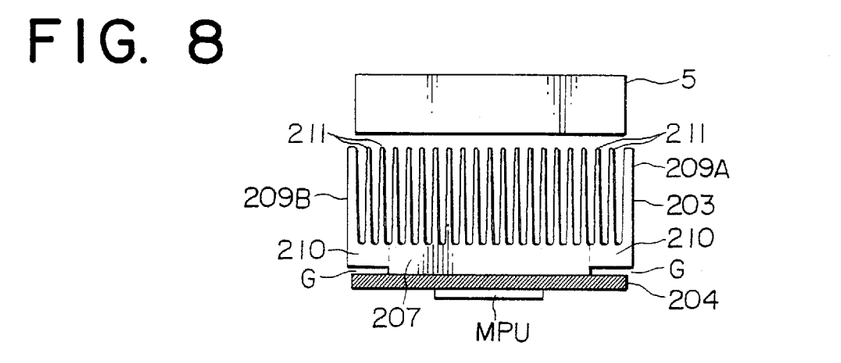
FIG. 8 is a side elevation view of the electronic component cooling apparatus shown in FIG. 7.
Figure 9:
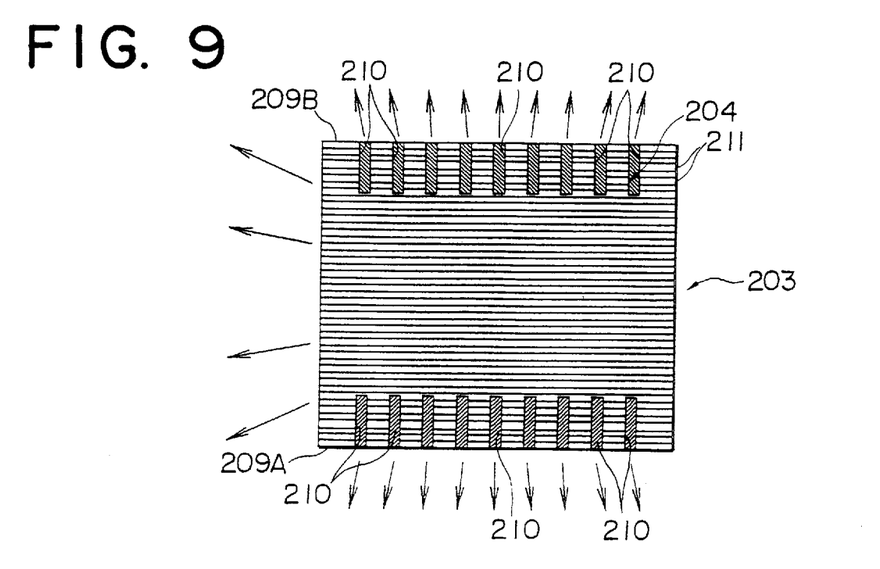
FIG. 9 is a plan view showing a heat sink incorporated in the electronic component cooling apparatus of FIG. 7.

Referring now to FIGS. 7 to 9, a third embodiment of an electronic component cooling apparatus according to the present invention is illustrated. In connection with the illustrated embodiment, reference numerals likewise correspond to those discussed in the first embodiment described above, except with an additional prefix of 200, i.e., such that the radiation fins 11 previously indicated is now radiation fins 211, etc. In FIG. 9, arrows each indicate each of streams of air blown against a heat sink 203 from an axial fan unit 5 and then discharged from the heat sink 203. In the illustrated embodiment, a base 207 of the heat sink 203 has a good heat-transfer plate 204 joined to a rear surface thereof so that heat may be transferred from an electronic component MPU acting as a heat source therethrough to at least a portion of the base 207 of the heat sink 203 which is formed wish parting slits 210. The good heat-transfer plate 204 may be made of a material which is superior in thermal conductivity to a material for the base 207 of the heat sink 203. For example, copper may be used for this purpose. Such construction permits heat generated from the electronic component to be rapidly transferred to a portion of the heat sink 203 reduced in temperature, to thereby further enhance cooling efficiency. In the illustrated embodiment, the base 207 of the heat sink 203 is formed at a portion thereof at which the parting slits 210 are provided into a thickness smaller than that of the remaining portion thereof so that a gap G may be defined between a bottom surface of the base 207 of the heat sink 203 and an outer periphery of the good heat-transfer plate 204. Such configuration permits the outer periphery of the good heat-transfer plate 204 to be satisfactorily cooled by air discharged from the parting slits 210, to thereby more further enhance cooling efficiency in cooperation with arrangement of the good heat-transfer plate 204.

The base 207 of the heat sink 203 may be formed into a uniform thickness. Such configuration causes an opening of each of the parting slits 210 to be closed with the good heat-transfer plate 204. Even in this case, a portion of the good heat-transfer plate 204 exposed through the openings of the parting slits 210 is cooled by air discharged from the fan unit 5, resulting in cooling efficiency being improved. Also, an increase in cooling efficiency may be attained by forming the good heat-transfer plate 204 into a size reduced to a degree sufficient to keep it from extending beyond a position at which the parting slits 20 are formed.

Figure 10:
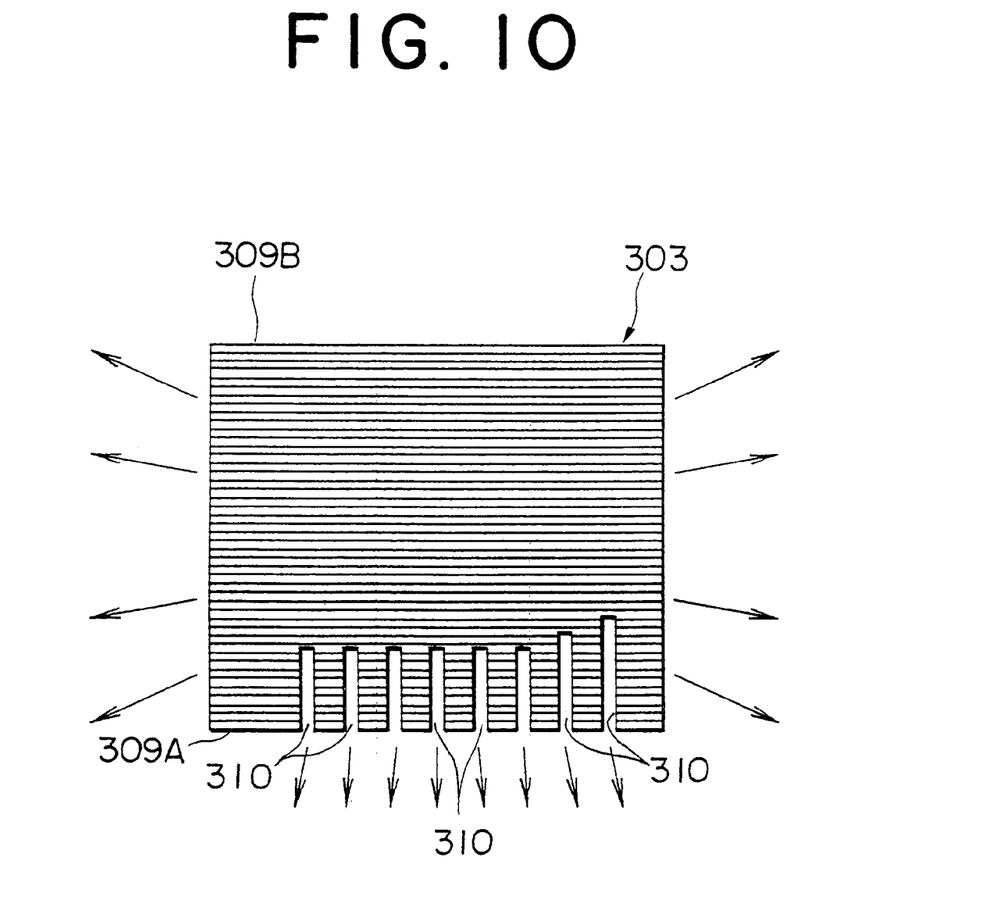
FIG. 10 is a plan view showing a heat sink formed on only an outside of a side surface thereof with parting slits.

A concept of the present invention that the heat sink is formed with the parting slits to enhance cooling efficiency may be effectively applied to mounting of the fan unit on the heat sink in a manner different from those in the embodiments described above. FIG. 10 shows a further embodiment of an electronic component cooling apparatus according to the present invention. In an electronic component cooling apparatus of the illustrated embodiment, parting slits 310 are formed on only an outside of one of side wall 309A of a heat sink 303. In the illustrated embodiment, the parting slits 310 are so formed that a length thereof is varied depending on a position at which the parting slits 310 are arranged. This is for the reason that a region of the heat sink 303 which is not opposite to blades of an impeller is substantially circular, therefore, formation of the parting slits 310 into a length which keeps the parting slits 310 from entering the region necessarily causes a variation in length of the parting slits. For example, the parting slits 310 may be so formed that a length thereof is increased toward both ends of the heat sink 303 in a longitudinal direction thereof or decreased toward a central portion of the heat sink in the longitudinal direction. In FIG. 10, arrows each indicate each of streams of air blown against the heat sink 303 from an axial fan unit 5 and then discharged from the heat sink 303.

In each of the embodiments described above, the preform for the heat sink is provided by extrusion molding. However, it is a matter of course that it may be formed by any other suitable techniques such as casting or the like.

As can be seen form the foregoing, the electronic component cooling apparatus of the present invention is so constructed that the parting slits are formed into a length which prevents the parting slits from interrupting continuity of the portion of the radiation fins which are not exposed directly to air flow generated by rotation of the blades of the impeller. Such construction permits heat at the portion of the radiation fins which is not opposite to the blades of the axial fan unit to be discharged through the outer portion of the radiation fins continuous with the above-described portion and directly cooled by the axial fan unit. Thus, the electronic component cooling apparatus of the present invention effectively reduces a temperature of the central portion of the heat sink, to thereby enhance cooling efficiency.

Further, the electronic component cooling apparatus of the present invention is constructed so as to permit air flow generated by the fan unit to be passed through the slit sections, to thereby further enhance cooling efficiency. Also, the positioning fit projections provided on the side walls of the casing are fitted in the slit sections to provide the detachment or disengagement preventing structure, to thereby prevent release of engagement between the casing and the heat sink when force of sliding both relative to each other is applied to one of them. In addition, the present intention may be so constructed that the side walls of the heat sink are formed into a length larger than that of the side walls of the casing and the side walls of the heat sink are formed with the slit sections so as to extend by a distance larger than a length of the side walls of the casing, to thereby vary a position at which the fan unit is mounted on the heat sink. This permits the fan unit to be positioned in conformity to the heat generation source of the electronic component mounted on the rear surface of the base of the heat sink, resulting in more further improving cooling efficiency.

While preferred embodiment of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An electronic component cooling apparatus comprising:
    a heat sink including a base and a pair of side walls arranged so as to be raised from a pair of ends of said base opposite to each other;
    said base having a rear surface mounted thereon with an electronic component to be cooled and a front surface provided thereon with a plurality of radiation fins;
    said radiation fins being positioned between said side walls of said heat sink; and
    an axial fan unit including an impeller provided with a plurality of blades, a motor including a revolving shaft fixedly mounted thereon with a rotor on which said impeller is mounted and acting to rotate said impeller, a casing provided with an opening for receiving said impeller and motor therein, and a plurality of webs for connecting a housing of said motor and said casing to each other so as to position said motor at a central portion of said opening;
    said axial fan unit forcibly guiding air in an axial direction of said revolving shaft;
    said radiation fins of said heat sink being arranged in a manner to be parallel to said side walls of said heat sink and spaced from each other at predetermined intervals;
    said heat sink having a plurality of parting slits formed therein, said parting slits being spaced from each other at predetermined intervals and extending continuously from an outside of at least one of said side walls of said heat sink into said heat sink to interrupt continuity of a part of said base, said at least one side wall of said heat sink and said radiation fins adjacent to said side walls of said heat sink:
    said parting slits being arranged so as not to interrupt continuity of a portion of said radiation fins, wherein said uninterrupted portion of said radiation fins faces said impeller and is not exposed directly to air flow generated by rotation of said blades of said impeller.

2. An electronic component cooling apparatus as defined in claim 1, wherein said parting slits are formed from an outside of each of said side walls of said heat sink into said heat sink.

3. An electronic component cooling apparatus as defined in claim 1, wherein said base of said heat sink has a good heat-transfer plate joined to said rear surface thereof so as to transfer heat from a heat source to at least said part of said base formed with said parting slits;
    said good heat-transfer plate being made of a material superior in thermal conductivity to that for said base.

4. An electronic component cooling apparatus as defined in claim 3, wherein said good heat-transfer plate is so arranged that a part thereof is cooled by air flowing through an opening of each of said parting slits interrupting continuity of said base.

5. An electronic component cooling apparatus as defined in claim 4, wherein said base is formed at said part thereof at which said parting slits are formed into a thickness smaller than that of the remaining part thereof so that a gap may be defined between a bottom surface of said base and said part of said good heat-transfer plate.

6. An electronic component cooling apparatus as defined in claim 1, wherein said parting slits are varied in length depending on a position at which said parting slits are formed.

7. An electronic component cooling apparatus comprising:
    a heat sink made of metal and including a base and a pair of side walls arranged so as to be raised from a pair of ends of said base opposite to each other and in a manner to be integral with said base;
    said base having a rear surface mounted thereon with an electronic component to be cooled and a front surface provided thereon with a plurality of radiation fins;
    said radiation fins being positioned between said side walls of said heat sink; and
    an axial fan unit including an impeller provided with a plurality of blades, a motor including a revolving shaft fixedly mounted thereon with a rotor on which said impeller is mounted and acting to rotate said impeller, a casing provided with a suction opening for receiving said impeller and motor therein, and a plurality of webs for connecting a housing of said motor and said casing to each other so as to position said motor at a central portion of said suction opening;
    said axial fan unit forcibly blowing air sucked in through said suction opening against said heat sink;
    said radiation fins of said heat sink being arranged in a manner to be parallel to said side walls of said heat sink and spaced from each other at predetermined intervals;
    said heat sink having a plurality of parting slits formed therein, said parting slits being spaced from each other at predetermined intervals in a direction in which said radiation fins extend;
    said parting slits being arranged to continuously extend from an outside of each of said side walls of said heat sink into said heat sink to interrupt continuity of a part of said base, said side walls of said heat sink and said radiation fins adjacent to said side walls of said heat sink;
    said parting slits being arranged so as not to interrupt continuity of a portion of said heat sink that faces said impeller and is positioned opposite said blades of said impeller.

8. An electronic component cooling apparatus as defined in claim 7, wherein said casing of said fan unit includes an opposite wall arranged opposite to said front surface of said base of said heat sink so as to be spaced therefrom at an interval and a pair of side walls arranged so as to extend from a pair of edges of said opposite wall opposite to each other toward said heat sink;
    said side walls of said casing each being formed thereon with a plurality of engaging sections in a manner to be spaced from each other;
    said side walls of said heat sink are formed with a plurality of engaged sections engaged with said engaging sections of said side walls of said casing; and
    said side walls of said heat sink are formed with a plurality of slit sections for air passage in a manner to extend from a distal end thereof toward said base to guide air flow generated by said fan unit therethrough;
    said slit sections constituting a part of said parting slits;
    said side walls of said casing each being provided thereon with at least one positioning fit projection fitted in at least one of said slit sections;
    said positioning fit projections and engaging sections having positional relationship defined therebetween which permits said engaging sections and engaged sections to be engaged with each other while fitting said positioning fit projections in said slit sections.

9. An electronic component cooling apparatus as defined in claim 8, wherein said side walls of said casing each are integrally provided thereon with two hooks in a manner to be spaced from each other;

said hooks of each of said side walls of said casing being positioned inside the remaining part of said side walls of said casing so as to be positioned inside said side walls of said heat sink when said heat sink and casing are kept combined with each other;

said hooks each having an engaging surface outwardly extending;

said side walls of said heat sink are formed on an inner surface thereof with engaged surfaces engaged with said engaging surfaces of said hooks;

said hooks of said side walls of said casing constituting said engaging sections;

said engaged surfaces of said side walls of said heat sink constituting said engaged sections.

10. An electronic component cooling apparatus as defined in claim 8, wherein said side walls of said heat sink are formed into a length larger than that of said side walls of said casing; and said side walls of said heat sink are formed with a plurality of slit sections which extend by a distance larger than a length of said side walls of said casing so that a position at which said fan unit is mounted on said heat sink may be varied.

11. An electronic component cooling apparatus comprising:

a heat sink including a base and a pair of side walls arranged so as to be raised from a pair of ends of said base opposite to each other and in a manner to be integral with said base;

said base having a rear surface mounted thereon with an electronic component to be cooled and a front surface provided thereon with a plurality of radiation fins;

said radiation fins being positioned between said side walls of said heat sink; and an axial fan unit including an impeller provided with a plurality of blades, a motor including a revolving shaft fixedly mounted thereon with a rotor on which said impeller is mounted and acting to rotate said impeller, a casing provided with an opening for receiving said impeller and motor therein, and a plurality of webs for connecting a housing of said motor and said casing to each other so as to position said motor at a central portion of said opening;

said radiation fins of said heat sink being arranged in a manner to be parallel to said side walls of said heat sink and spaced from each other at predetermined intervals;

said casing of said fan unit including an opposite wall arranged opposite to said front surface of said base of said heat sink so as to be spaced therefrom at an interval and a pair of side walls arranged so as to extend from a pair of edges of said opposite wall opposite to each other toward said heat sink;

said side walls of said casing each being formed thereon with a plurality of engaging sections in a manner to be spaced from each other;

said side walls of said heat sink being formed with a plurality of engaged sections engaged with said engaging sections of said side walls of said casing;

said heat sink being formed with a plurality of parting slits so as to be spaced from each other at predetermined intervals;

said parting slits being arranged in a manner to continuously extend from an outside of each of said side walls of said heat sink into said heat sink to interrupt continuity of a part of said base and said radiation fins adjacent to said side walls of said heat sink;

said parting slits providing said side walls of said heat sink with a plurality of slits for air passage which extend from a distal end of said side walls of said heat sink toward said base to guide air flow generated by said fan unit therethrough;

said slits being arranged so as to be spaced from each other at predetermined intervals in a direction perpendicular to a direction in which said slits extend;

said side walls of said casing each being provided thereon with at least one positioning fit projection fitted in at least one of said slits;

said positioning fit projections and engaging sections having positional relationship defined therebetween which permits said engaging sections and engaged sections to be engaged with each other while fitting said positioning fit projections in said slits.

\* \* \* \* \*